US011735438B2

(12) United States Patent
Velazquez et al.

(10) Patent No.: US 11,735,438 B2
(45) Date of Patent: Aug. 22, 2023

(54) METHODS AND APPARATUS FOR MARANGONI DRYING

(71) Applicant: Applied Materials, Inc., Santa Clara, CA (US)

(72) Inventors: Edwin Velazquez, Union City, CA (US); Jagan Rangarajan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 835 days.

(21) Appl. No.: 16/700,738

(22) Filed: Dec. 2, 2019

(65) Prior Publication Data

US 2020/0176279 A1 Jun. 4, 2020

Related U.S. Application Data

(60) Provisional application No. 62/774,746, filed on Dec. 3, 2018.

(51) Int. Cl.
*H01L 21/67* (2006.01)
*H01L 21/02* (2006.01)

(52) U.S. Cl.
CPC .. *H01L 21/67034* (2013.01); *H01L 21/02057* (2013.01); *H01L 21/67057* (2013.01)

(58) Field of Classification Search
CPC ....... H01L 21/00–86; H01L 21/02041–02101; H01L 21/67017–67086; H01L 21/67051; H01L 21/67034; H01L 21/67057; B05B 1/00–17/085; B05B 13/02–0494;
(Continued)

(56) References Cited

U.S. PATENT DOCUMENTS

| 5,505,645 A | * | 4/1996 | Engler, Jr. | ............. A45B 23/00 135/16 |
| 5,609,305 A | | 3/1997 | Webb | |
| 6,082,377 A | | 7/2000 | Frey | |

(Continued)

FOREIGN PATENT DOCUMENTS

| CN | 108831849 A | * | 11/2018 | ....... H01L 21/02041 |
| JP | 2007111612 A | * | 5/2007 | ............. B05B 1/005 |
| TW | 201505726 A | | 2/2015 | |

OTHER PUBLICATIONS

International Search Report and Written Opinion for Application No. PCT/US2019/064027 dated Mar. 20, 2020.

(Continued)

*Primary Examiner* — Natasha N Campbell
*Assistant Examiner* — Richard Z. Zhang
(74) *Attorney, Agent, or Firm* — Patterson + Sheridan, LLP

(57) ABSTRACT

A method and apparatus for Marangoni substrate drying is disclosed which includes an adjustable spray bar assembly having mounting brackets coupled to a support structure of a drying system, a base assembly coupled to the mounting brackets and disposed parallel to a face of the support structure, and a mounting assembly coupled to and parallel with the base assembly. The mounting assembly is adjustable in a vertical direction at two distal ends. The mounting assembly includes arms onto which one or more spray bars may be disposed. While secured to the mounting assembly, the one or more spray bars may be rotated about a longitudinal axis.

19 Claims, 4 Drawing Sheets

(58) Field of Classification Search
CPC ......... B05B 15/60–68; B05B 15/70–74; F16H 25/00–2472
See application file for complete search history.

(56) References Cited

U.S. PATENT DOCUMENTS

| | | | |
|---|---|---|---|
| 6,164,297 | A | 12/2000 | Kamikawa |
| 8,869,422 | B2 | 10/2014 | Velazquez et al. |
| 2002/0121289 | A1 | 9/2002 | Brown et al. |
| 2003/0200988 | A1* | 10/2003 | Brown .............. H01L 21/67751 134/1.3 |
| 2004/0035849 | A1* | 2/2004 | Narita ............... H01L 21/67138 219/444.1 |
| 2004/0200409 | A1 | 10/2004 | Svirchevski |
| 2008/0053486 | A1 | 3/2008 | Tang et al. |
| 2009/0078292 | A1 | 3/2009 | Stein et al. |
| 2011/0174783 | A1* | 7/2011 | Suzuki .................... B23H 7/28 219/69.15 |
| 2012/0235342 | A1 | 9/2012 | Kurata |
| 2013/0283634 | A1 | 10/2013 | Velazquez et al. |
| 2016/0178279 | A1 | 6/2016 | Velazquez et al. |

OTHER PUBLICATIONS

Office Action for Taiwan Application No. 108143878 dated Jun. 6, 2023.
Search Report for Taiwan Application No. 108143878 dated Jun. 6, 2023.

\* cited by examiner

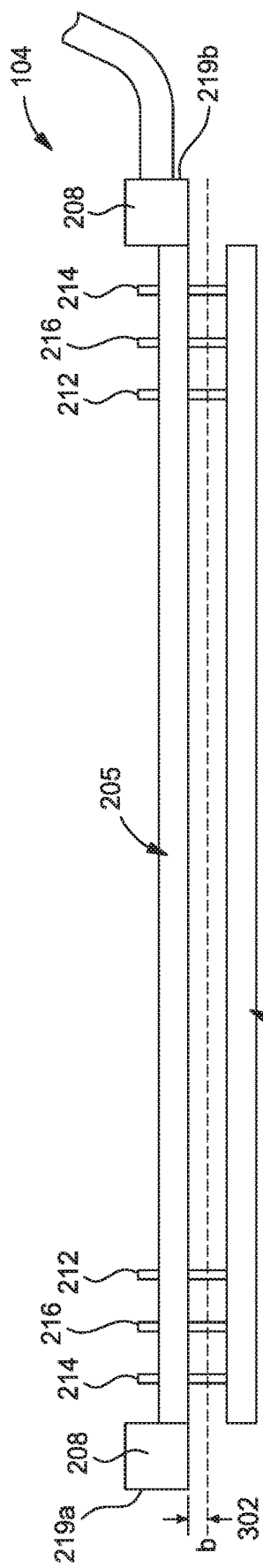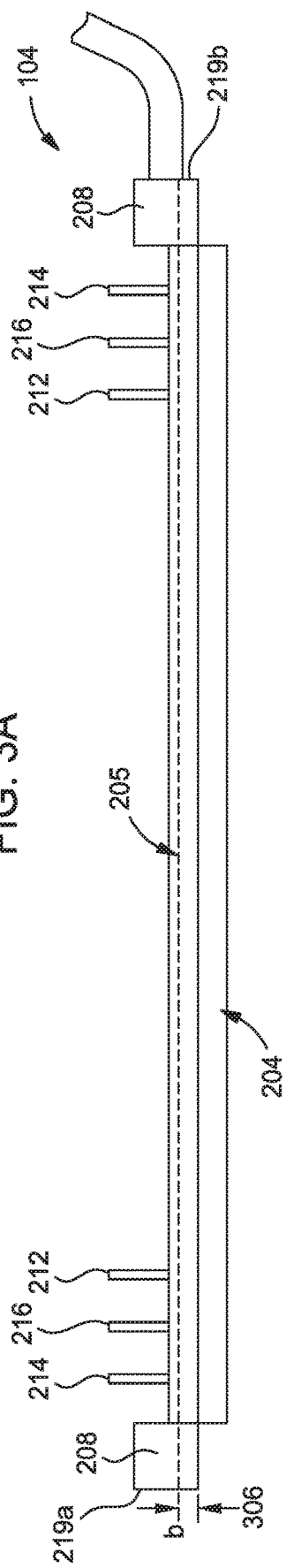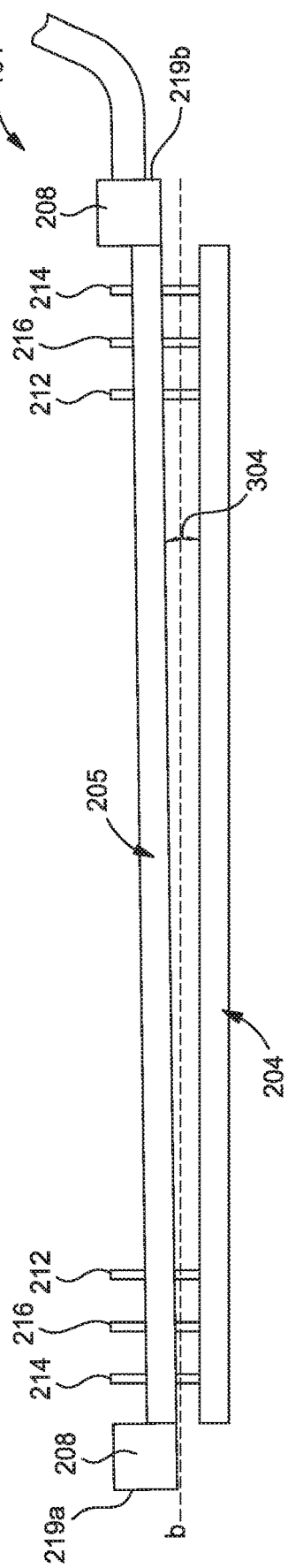

METHODS AND APPARATUS FOR MARANGONI DRYING

CROSS-REFERENCE TO RELATED APPLICATIONS

This application claims benefit of U.S. provisional patent application Ser. No. 62/774,746, filed Dec. 3, 2018, which is herein incorporated by reference in its entirety.

BACKGROUND

Field

Embodiments described herein generally relate to methods and apparatus for cleaning substrates. More specifically, embodiments described herein relate to methods and apparatus for drying of wet substrates in post chemical mechanical polishing systems.

Description of the Related Art

As semiconductor device geometries continue to decrease, the utilization of processes for enabling the ultra-clean processing of substrates have substantially increased. Post chemical mechanical polish (CMP) cleaning is traditionally a wet process performed to clean and dry a substrate without leaving particles or residue on the substrate, which can negatively affect yield and cause subsequent device failure. In the process of drying the wet substrate, particles in the solution may adhere to the substrate or particles present on the substrate may not be adequately removed prior to drying and may remain on the substrate after drying. Accordingly, much attention has been directed to improved methods for drying a substrate after CMP processing.

Marangoni drying creates a surface tension gradient to induce bath fluid to flow from a substrate in a manner that leaves the substrate virtually free of the bath fluid. Thus, the employment of Marangoni drying may avoid streaking, spotting, and residue marks on the substrate. The Marangoni drying technique utilizes a solvent with a lower surface tension than the bath fluid (i.e., isopropyl alcohol (IPA) vapor) that is introduced to a fluid meniscus which forms as the substrate is lifted from the bath. The solvent vapor dissolves into the fluid meniscus, creating a surface tension gradient. The presence of a surface tension gradient causes the bath fluid to flow away from a region of low surface tension at the tip of the drying meniscus and off the substrate, leaving it dry and virtually free of streaking, spotting, and residue marks.

Current Marangoni drying systems utilize a static spray bar to deliver a solvent vapor to a front and back side of a substrate after aqueous cleaning in a fluid bath. This approach, however, has limitations such as variability between chamber conditions, which creates inconsistent drying results between batches of processed substrate. For example, variations in bath fluid levels and mechanical chamber characteristics may cause inconsistencies in the amount of streaking, spotting, and residue marks left on dried substrates from one chamber to another.

Thus, what is needed in the art are improved apparatus to provide for more consistent substrate drying results between chambers.

SUMMARY

In one embodiment, an apparatus is provided. The apparatus includes a base and a mounting assembly. The mounting assembly further includes a crossbar having a plurality of orifices extending from a top surface of the crossbar to a bottom surface of the crossbar, a guide pin disposed within the plurality of orifices of the crossbar and in contact with the base, a leveler disposed within the plurality of orifices and in contact with the base, and two arms coupled to the crossbar. The guide pin is configured to align the base and mounting assembly and the leveler is configured to vertically position the crossbar relative to the base. Each arm is orthogonally disposed at opposing distal ends of the crossbar and configured to support one or more spray bars.

In one embodiment, an apparatus is provided. The apparatus includes a base and a mounting assembly. The mounting assembly further includes a crossbar having a plurality of first orifices extending from a top surface of the crossbar to a bottom surface of the crossbar, two or more guide pins disposed within the plurality of first orifices of the crossbar and in contact with the base, two or more levelers disposed within the plurality of first orifices and in contact with the base, and two arms coupled to the crossbar. At least one each of the two or more guide pins and the two or more levelers is located at each distal end of the crossbar. The two arms are orthogonally disposed at opposing distal ends of the crossbar and further comprise one or more second orifices. One or more spray bars are disposed on the one or more second orifices of the two arms.

In one embodiment, a method of Marangoni drying is proved. The method includes positioning a spray bar assembly including mounting brackets, a base coupled to the mounting brackets, a mounting assembly coupled to the base and one or more spray bars disposed onto the mounting assembly. The one or more spray bars are adapted to direct vapor towards a substrate. The method further includes adjusting the spray bars to a desired position and rotation about an x, y, and z axis, lifting a substrate from a rinse pool and through the spray bar assembly, and directing a vapor onto the substrate surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 3A illustrates a side view of an adjustable spray bar assembly in a raised position according to one embodiment of the present disclosure.

FIG. 3B illustrates a side view of an adjustable spray bar assembly in a lowered position according to one embodiment of the present disclosure.

FIG. 3C illustrates a side view of an adjustable spray bar assembly in a tilted orientation according to one embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method and apparatus for Marangoni substrate drying is disclosed which includes an adjustable spray bar assembly having mounting brackets coupled to a support structure of a drying system, a base assembly coupled to the mounting brackets and disposed parallel to a face of the support structure, and a mounting assembly coupled to and parallel with the base assembly. The mounting assembly is adjustable in a vertical direction at two distal ends. The mounting assembly includes arms onto which one or more spray bars may be disposed. While secured to the mounting assembly, the one or more spray bars may be rotated about a longitudinal axis.

Figure 1:
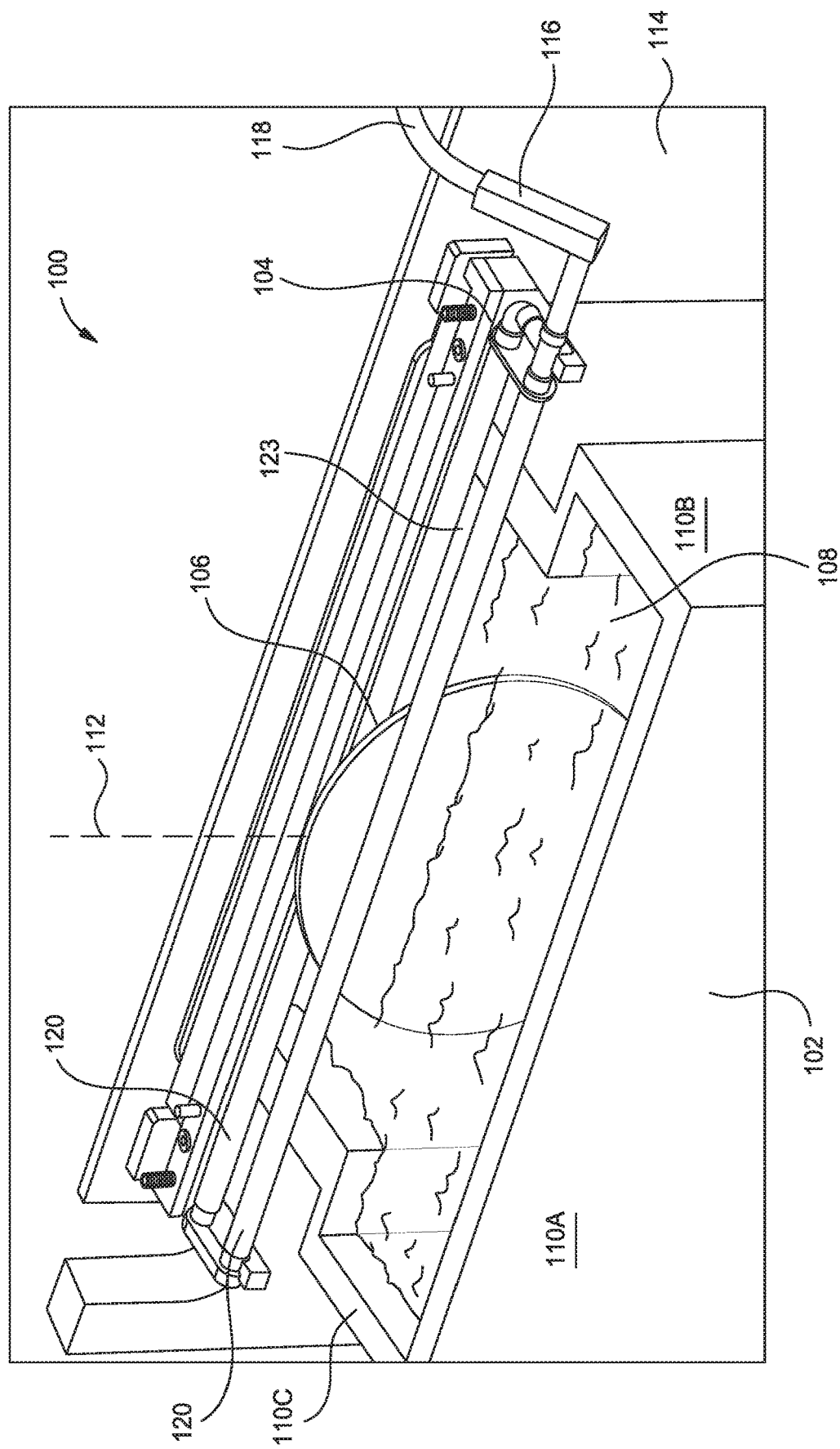
FIG. 1 illustrates a perspective view of a substrate drying system according to one embodiment of the present disclosure.

FIG. 1 illustrates a perspective view of a substrate drying system 100 including a spray assembly 104 according to one embodiment. The drying system 100 includes a rinse tank 102 and the spray assembly 104. The rinse tank 102 is configured to be filled with a rinse fluid 108, such as deionized water or other suitable fluids adapted to remove particles from the substrate 106. In one embodiment, the substrate 106 is a semiconductor substrate. In one embodiment, the substrate 106 is a 300 mm substrate. In other embodiment, the substrate 106 is a 200 mm substrate or a 450 mm substrate.

The rinse tank 102 is made of materials suitable for containing the rinse fluid 108, such as aluminum, stainless steel, and alloys thereof, or various polymeric materials. The rinse tank 102 has a plurality of sidewalls 110A, 110B, 110C, which define a volume sized to accommodate the substrate 106. The spray assembly 104 is disposed above the rinse tank 102 within the drying system 100. The spray assembly 104 includes two or more spray bars 120a, 120b (collectively 120) disposed through openings (not shown) within the spray assembly 104 and atop the rinse fluid 108. The spray bars 120 may be situated within the drying system 100 to form a channel 123 through which the substrate 106 is transported along a substrate travel path 112.

The drying system 100 also includes a lifting mechanism (not shown) adapted to vertically lift the substrate 106 out of the rinse fluid 108 and through the spray assembly 104 along the path 112. In one embodiment, the lifting mechanism is coupled to rinse tank 102. In another embodiment, the lifting mechanism is coupled to a support surface 114, which may function as a sidewall for the drying system 100.

As the substrate 106 is lifted through the spray assembly 104, a volatile organic compound (VOC) vapor is directed by the one or more spray bars 120 towards an air/liquid interface on either side of substrate 106 in order to dry the substrate. In one embodiment, the VOC vapor is isopropyl alcohol (IPA) or other suitable compounds, and is supplied to the spray assembly 104 via flexible vapor supply fittings 116 and vapor lines 118. In one embodiment, the spray assembly 104 is coupled to the support surface 114. In other embodiments, the spray assembly 104 is coupled to other surfaces within the drying system 100, including the sidewalls 110A, 110B, and 110C of the rinse tank 102.

Figure 2:
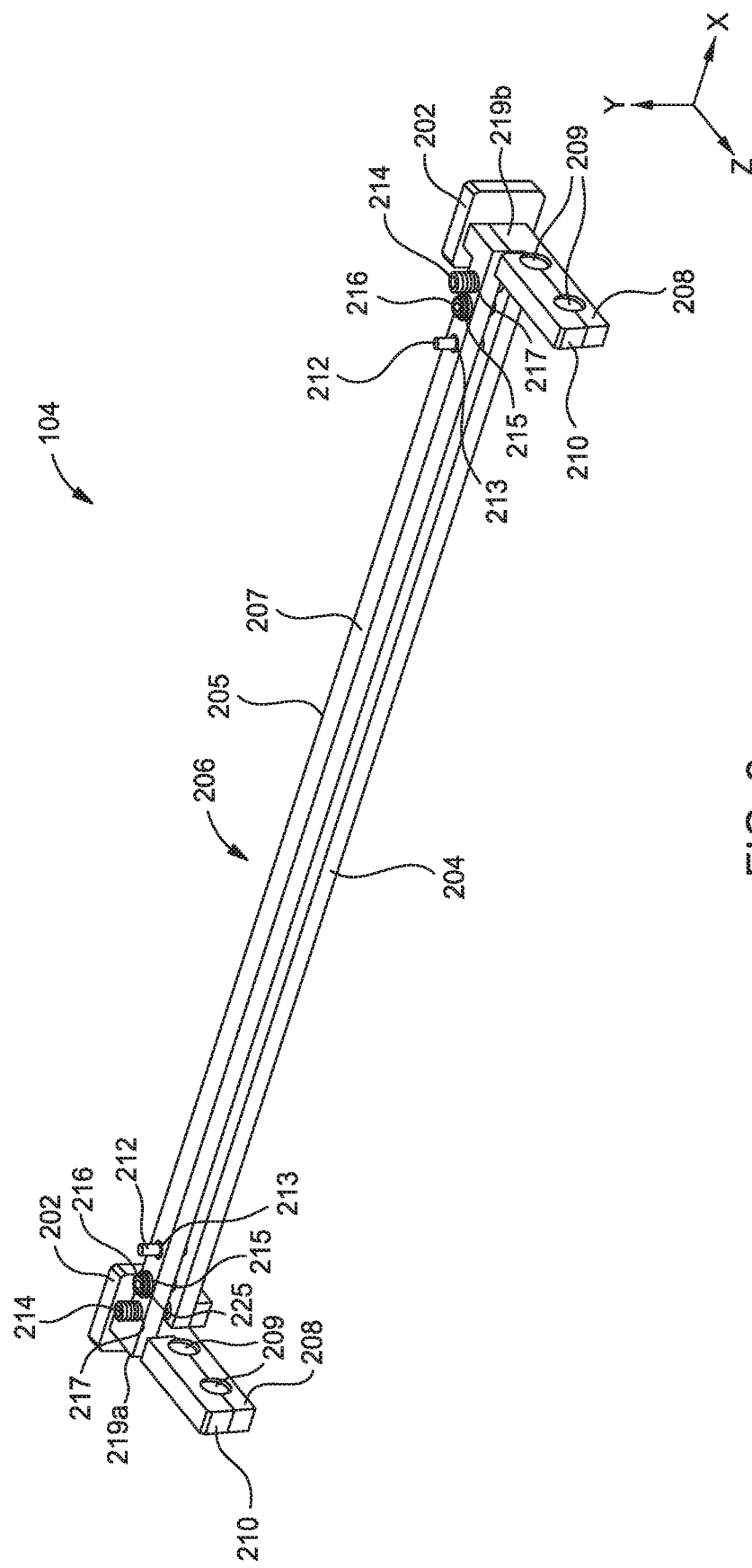
FIG. 2 illustrates a perspective view of an adjustable spray bar assembly according to one embodiment of the present disclosure.

FIG. 2 illustrates a perspective view of the spray assembly 104 according to one embodiment. The spray assembly 104 includes mounting brackets 202, a base assembly 204, and a mounting assembly 206. The mounting brackets 202 couple to a supporting structure within the drying system 100, such as the support surface 114, as shown in FIG. 1. In some embodiments, the mounting brackets 202 couple to the sidewalls 110A, 110B, and 110C of the rinse tank 102. The mounting brackets 202 may couple to a supporting structure via one or more of screws, pins, clasps, clamps, toggles, or the like. As such, the mounting brackets 202 provide an attachment point for the spray assembly 104 within drying system 100.

The base assembly 204 is coupled to the mounting brackets 202. Together with the mounting brackets 202, the base assembly 204 provides static mechanical support for the spray assembly 104. In one embodiment, the base assembly 204 is an elongated quadrate rail coupled to the mounting brackets 202 at two distal ends of the base assembly, as shown in FIG. 2. However, in other embodiments, the base assembly 204 may vary in size, shape, and coupling point with the mounting brackets 202. For example, the base assembly may be a short annular rod coupled to the mounting brackets 202 at a medial point of the rod. In some embodiments, the base assembly 204 is permanently affixed to mounting brackets 202 to form a single fixture. The base assembly 204 and the mounting brackets 202 are disposed along the support surface 114 or other supporting structure such that the base assembly 204 is situated perpendicularly to the travel path 112 the substrate 106 travels within the drying system 100.

The mounting assembly 206 is coupled to the base assembly 204. The mounting assembly 206 may be disposed above, below, or adjacent to the base assembly 204. The mounting assembly 206 includes one or more arms 208 extending from a crossbar 205. In one embodiment, the arms 208 are perpendicularly oriented in relation to a longitudinal length of the crossbar 205 and the base assembly 204. In one embodiment, two arms 208 are disposed at opposing distal ends 219a and 219b (collectively 219) of the crossbar 205 to approximate a "C" shape when viewed from a top or bottom perspective, as shown in FIG. 2. In another embodiment, the one or more arms 208 extend from the mounting assembly 206 at non-orthogonal angles in relation to the crossbar 205. In yet another embodiment, the one or more arms 208 extend from a medial point on the crossbar 205.

The arms 208 provide coupling points for the one or more spray bars 120. The spray bars 120 are removably coupled to the arms 208. In one embodiment, two spray bars 120 (illustrated in FIG. 1) are positioned in parallel at a distance that enables the substrate 106 to be lifted between the two spray bars 120 on travel path 112 such that vapor may be sprayed towards two opposing sides of the substrate 106 simultaneously. The spray bars 120 are secured to the arms 208 via clamps 210 or other suitable devices. In one embodiment, the spray bars 120 may be disposed through horizontally bored holes 209 within the arms 208. When secured to the arms 208, the spray bars 120 may be rotated about their longitudinal axis to facilitate vapor spraying towards the substrate 106 on travel path 112 at any desired angle.

The crossbar 205 has a plurality of holes disposed therethrough. The plurality of holes extends vertically through the crossbar 205 from a top surface 207 to a bottom surface (not shown) facing the base assembly 204. The plurality of holes includes a pilot hole 213, a locking hole 215, and a leveling hole 217. In one embodiment, the plurality of holes 211 on crossbar the 205 includes a pair of pilot holes 213, a pair of locking holes 215, and a pair of leveling holes 217. In one embodiment, one of each pair of the pilot holes 213, locking holes 215, and leveling holes 217 is disposed at each distal end 219 of the crossbar 205, as shown in FIG. 2.

One pilot hole 213, one locking hole 215, and one leveling hole 217 are disposed laterally adjacent to each other at each distal end 219 of the crossbar 205. Each pilot hole 213 may be disposed medially on the crossbar 205 in relation to the locking holes 215 and the leveling holes 217. Each leveling hole 217 may be disposed distally on the crossbar 205 in relation to the pilot holes 213 and locking holes 215. Each locking hole 215 may be disposed intermediately between a pilot hole 213 and leveling hole 217 at each distal end 219 of the crossbar 205, as shown in FIG. 2. However, the spatial arrangement and ordering of the pilot holes 213, locking holes 215, and leveling holes 217 are contemplated to be interchangeable.

Guide pins 212, levelers 214, and locking screws 216 extend through the pilot holes 213, leveling holes 217, and locking holes 215, respectively. In one embodiment, a pair each of guide pins 212, levelers 214, and locking screws 216 extend through the pilot holes 213, leveling holes 217, and locking holes 215 at each distal end 219 of the crossbar 205. The guide pins 212, levelers 214, and locking screws couple the mounting assembly 206 to the base assembly 204.

The guide pins 212 extend through the pilot holes 213 and couple to (e.g., are in contact with) base assembly 204 to stabilize the mounting assembly 206 in relation to the base assembly 204. The pilot holes 213 are wider in diameter than the guide pins 212 and smoothly bored to provide alignment of the mounting assembly 206 with base assembly 204 while also facilitating tilting of the spray assembly 104. That is, the pilot holes 213 provide some leeway for the guide pins 212 so that the mounting assembly 206 may be tilted about an axis perpendicular to the crossbar 205 in a horizontal plane while still aligned with base assembly 204 along a vertical plane (e.g., in a vertical direction).

The levelers 214 extend through the leveling holes 217 and couple to (e.g., are in contact with) the base assembly 204 to enable vertical adjustment and tilting of spray assembly 104. The leveling holes 217 and levelers 214 are threaded to allow the levelers 214 to be torqued through the leveling holes 217. Torqueing the levelers 214 within the leveling holes 217 causes the mounting assembly 206 to raise or lower vertically in relation to the base assembly 204.

In the embodiment illustrated by FIG. 2, the mounting assembly 206 may be uniformly raised or lowered at each distal end 219 by equally torqueing the levelers 214, thus leaving the mounting assembly 206 substantially parallel with a horizontal plane. Alternatively, the mounting assembly 206 may be vertically tilted towards either distal end 219 by variably torqueing each leveler 214. That is, torqueing only one of the pair of levelers 214, or torqueing both levelers 214 in the same direction at unequal amounts, or torqueing each leveler 214 in a different direction will cause the mounting assembly 206 to tilt in relation to the base assembly 204, as depicted in FIG. 3C.

The locking screws 216 extend through the locking holes 215 and couple (e.g., are in contact with) to the base assembly 204 to secure the mounting assembly 206 in place. The locking screws 216 and locking holes 215 are threaded so as to allow the locking screws 216 to be torqued through the locking holes 215. Once mounting assembly 206 is adjusted to a desired height and tilt by torqueing of the levelers 214, the locking screws 216 are torqued through the locking holes 215 to fix the mounting assembly 206 in the desired position. To accommodate for tilting of the mounting assembly 206 without jamming the locking screws 216 within locking holes 215, each locking screw 216 is coupled with a pair of annular washers 225. Each of the pair of annular washers 225 is disposed at one opening of each locking hole 215 located at the top surface 207 and bottom surface (not shown) of crossbar 205. The annular washers 225 automatically adjust the orientation of the locking screws 216 within the locking holes 215 so that the locking screws 216 extend substantially straight through the locking holes 215, thus compensating for any angular deviation caused by tilting of the mounting assembly 206.

The combination of tilting, raising, and lowering the mounting assembly 206 via the levelers 214, in addition to rotating the spray bars 120 disposed in the arms 208, enables the spray bars 120 to be adjusted to a desired position about an x-, y-, and z-axis for directing a vapor towards the passing substrate. More specifically, the spray bars 120 may be rotated about the x- and z-axes, and linearly shifted on the y-axis. As illustrated in FIG. 2, the x-axis is a horizontal line parallel to a longitudinal axis of the mounting assembly 206 and spray bars 120. The y-axis is a line perpendicular to the longitudinal axis of the mounting assembly 206 and spray bars 120 in a vertical direction. The z-axis is a line perpendicular to the longitudinal axis of the mounting assembly 206 and spray bars 120 in a horizontal direction.

FIGS. 3A-3C illustrate the adjustable nature of the spray assembly 104 according to some embodiments. FIG. 3A illustrates a side view of the spray assembly 104 in a raised position according to one embodiment. In FIG. 3A, a pair of leveling screws 214, each located at opposite distal ends 219 of the crossbar 205, have been equally torqued in one direction, for example, clockwise. The equal torqueing of the threaded leveling screws 214 through the threaded leveling holes 217 causes the mounting assembly 206, and consequently the spray bars 120, to uniformly raise a distance 302 from baseline B at both distal ends 219 of the mounting assembly 206. The base assembly 204 remains static during torqueing of the leveling screws 214, acting as a mechanical support and coupling point for the leveling screws 214. As such, any gaps between the base assembly 204 and the mounting assembly 206 prior to adjustment are enlarged. Once the mounting assembly 206 is raised to a desired position, the threaded locking screws 216 are torqued through the threaded locking holes 215 to secure the mounting assembly 206 in place.

FIG. 3B illustrates a side view of the spray assembly 104 in a lowered position according to one embodiment. In FIG. 3B, a pair of leveling screws 214, each located at opposite distal ends 219 of the crossbar 205, have been equally torqued in a direction opposite that of FIG. 3A, for example, counter-clockwise. The equal torqueing of the threaded leveling screws 214 through the threaded leveling holes 217 causes the mounting assembly 206, and consequently the spray bars 120, to uniformly lower a distance 306 from baseline B at both distal ends 219 of the mounting assembly 206. The base assembly 204 remains static during torqueing of the leveling screws 214, acting as a mechanical support and coupling point for the leveling screws 214. As such, any gaps between the base assembly 204 and the mounting assembly 206 prior to adjustment are reduced. Once the mounting assembly 206 is lowered to a desired position, the threaded locking screws 216 are torqued through the threaded locking holes 215 to secure the mounting assembly 206 in place.

In the embodiments depicted in FIGS. 3A and 3B, the maximum vertical adjustment allowance of the spray assembly 104 is contemplated to be 10 mm, or 5 mm in either the up or down direction. However, the maximum adjustment allowance may vary depending on the horizontal length of the spray assembly 104.

FIG. 3C illustrates a side view of a spray assembly 104 in a tilted, or angled, position according to one embodiment. In FIG. 3C, the leveling screws 214 have been torqued in opposing directions, for example, clockwise and counter-clockwise, resulting in one distal end 219*b* of the mounting assembly 206 to be raised while the opposing distal end 219*a* is lowered. The variable adjustment of each distal end 219 causes the mounting assembly 206 to sit at an angle 304 in relation to base assembly 204. Although depicted in only one tilted orientation, the mounting assembly 206 may be tilted in either direction. Furthermore, in the embodiment illustrated in FIG. 3C, the maximum tilt adjustment allowance of mounting assembly 206 is contemplated to be 0.5 or 0.25° in either direction. However, it is also contemplated that the maximum tilt adjustment allowance may vary depending on the horizontal length of the mounting assembly 206.

Figure 4:
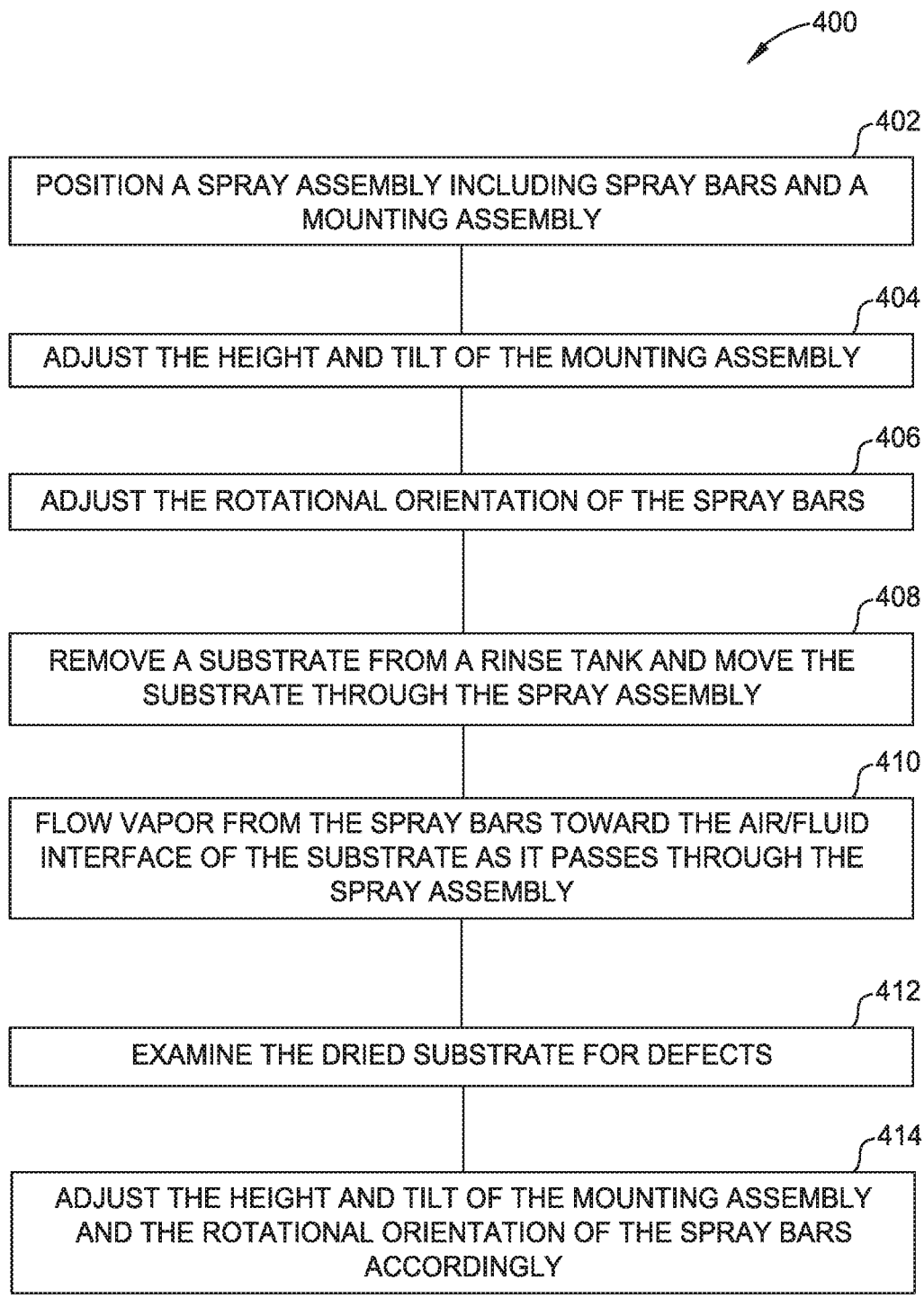
FIG. 4 is a flow chart diagram depicting a method of substrate drying according to one embodiment of the present disclosure.

FIG. 4 is a flow chart diagram depicting an example method 400 of Marangoni drying a substrate using the above-described apparatus as provided. In operation 402, a spray assembly is provided. The spray assembly includes a base assembly coupled to one or more mounting brackets. A mounting assembly is further coupled to the base assembly. Two spray bars are disposed and secured via clamps on the mounting assembly at a distance sufficient for a substrate to be passed through. In operation 404, levelers extending through the mounting assembly and coupling to the base assembly are torqued to raise, lower, or tilt the mounting assembly and consequently, the spray bars. In operation 406, the spray bars are rotated about their longitudinal axes to a desired angle for directing a vapor at the substrate. As a result of operations 404 and 406, the combination of rotating, tilting, and raising or lowering the spray bars enables the spray bars to be adjusted to a desired position and orientation about an x, y, and z axis for directing a vapor towards the passing substrate. More specifically, the spray bars may be rotated about the x and z axes, and linearly shifted on the y-axis.

In operation 408, a substrate is removed from a rinse tank and passed between the spray bars disposed in the spray assembly via a lifting mechanism located within the drying system. Vapor is then discharged from the spray bars and directed at both surfaces of the substrate as it passes through the spray bar assembly in operation 410. In operation 412, the dried substrate is examined for any defects remaining after the drying process such as streaking, spotting, and residue. Finally, in operation 414, a user adjusts the height and orientation of the spray bars in order to correct for any defects discovered on the substrate surface. Adjustment may be done manually by torqueing the leveling screws and rotating the spray bars within spray assembly.

Alternatively, defect analysis and subsequent adjustment may be automated. For example, substrates may be analyzed for defects with automated defect inspection tools. A user may then transmit a desired position and orientation of the spray bars using a graphical user interface either disposed on the drying system itself or a separate computer terminal. Once entered, the drying system may then automatically adjust the spray bars prior to the next drying cycle in order to correct for defects detected by the inspection tools. It is further contemplated that the entire process of defect inspection and spray bar assembly adjustment may be completely automated as to remove the need for any user input or intervention.

The embodiments herein advantageously minimize the surface defects of a substrate resulting from a Marangoni drying process. In conventional Marangoni drying systems, a static spray bar delivers solvent vapor to a front and back side of a substrate after aqueous cleaning. Variations in chamber conditions between substrate batches, such as rinse pool fluid levels and structural differences, cause inconsistent drying results with fluctuations in streaking, spotting, and other residue marks on substrate surfaces. By utilizing a spray bar assembly that is adjustable about an x, y, and z axis, the embodiments herein provide an apparatus and method for minimizing inconsistency or drying results between drying systems.

While the foregoing is directed to embodiments of the present disclosure, other and further embodiments of the disclosure may be devised without departing from the basic scope thereof, and the scope thereof is determined by the claims that follow.

What is claimed is:

1. An apparatus comprising:
    a base comprising an elongated rail configured to couple to a support surface of a fluid vessel;
    a mounting assembly disposed atop the base, the mounting assembly comprising:
        a crossbar having a plurality of first orifices extending from a top surface of the crossbar to a bottom surface of the crossbar and two distal ends;
        two or more guide pins disposed within a first set of orifices of the plurality of first orifices of the crossbar and in contact with the base, wherein at least one guide pin is located at each distal end of the crossbar;
        two or more levelers disposed within a second set of orifices of the plurality of first orifices and in contact with the base, wherein at least one leveler is located at each distal end of the crossbar;
        two arms coupled to the crossbar, each arm orthogonally disposed at one of the two distal ends of the crossbar and comprising one or more second orifices; and
        a locking screw disposed within a third orifice of the plurality of first orifices, wherein the third orifice of the plurality of first orifices is a threaded hole adapted to fit the locking screw, wherein the first set of orifices, the second set of orifices, and the third orifice are distinct from each other; and
    one or more spray bars disposed in the one or more second orifices of each of the two arms.

2. The apparatus of claim 1, wherein the one or more second orifices comprise at least two second orifices, and wherein two spray bars are disposed in the at least two second orifices, the two spray bars positioned to form a channel through which a substrate may be transported.

3. The apparatus of claim 2, wherein each spray bar is configured to direct a vapor towards an opposing side of the substrate as it is transported through the channel.

4. The apparatus of claim 1, wherein the one or more spray bars are rotatable about their longitudinal axis while disposed within the mounting assembly.

5. The apparatus of claim 1, wherein each of the two or more levelers may be individually torqued at varying amounts to tilt the mounting assembly.

6. The apparatus of claim 1, wherein the one or more spray bars are adjustable relative to an x-axis, a y-axis, and a z-axis.

7. An apparatus comprising:
    a fluid vessel comprising a support surface;

a base comprising an elongated rail, the elongated rail coupled to the fluid vessel;

a mounting assembly disposed atop the elongated rail of the base, the mounting assembly comprising:

a crossbar having a plurality of first orifices extending from a top surface of the crossbar to a bottom surface of the crossbar and two distal ends, wherein at least one of the plurality of first orifices is a smooth hole adapted to fit a guide pin;

two or more guide pins disposed within a first set of orifices of the plurality of first orifices of the crossbar and in contact with the base, wherein at least one guide pin is located at each distal end of the crossbar;

two or more levelers disposed within a second set of orifices of the plurality of first orifices and in contact with the base, wherein at least one leveler is located at each distal end of the crossbar;

two arms coupled to the crossbar, each arm orthogonally disposed at one of the two distal ends of the crossbar and comprising one or more second orifices; and a locking screw disposed within a third orifice of the plurality of first orifices, wherein the third orifice is a threaded hole adapted to fit the locking screw, wherein the first set of orifices, the second set of orifices, and the third orifice are distinct from each other; and one or more spray bars disposed in the one or more second orifices of each of the two arms.

8. The apparatus of claim 7, wherein each of the two or more levelers comprise a threaded screw.

9. The apparatus of claim 8, wherein at least one of the plurality of first orifices is a threaded hole adapted to fit at least one of the two or more levelers.

10. The apparatus of claim 7, wherein the first set of orifices comprises the smooth hole.

11. The apparatus of claim 10, wherein the smooth hole is conically shaped to facilitate tilting of the mounting assembly.

12. The apparatus of claim 7, wherein each of the two or more guide pins is configured to align the base and the mounting assembly in a vertical direction.

13. The apparatus of claim 7, wherein each of the two or more levelers may be individually torqued at varying amounts to tilt the mounting assembly.

14. The apparatus of claim 7, wherein the two arms further comprise clamps configured to receive the one or more spray bars.

15. The apparatus of claim 7, wherein the one or more spray bars are two spray bars, the two spray bars are disposed in two respective second orifices of each of the two arms, the two spray bars are positioned to form a channel through which a substrate may be transported.

16. The apparatus of claim 15, wherein each of the two spray bars is configured to direct a vapor towards a surface of a substrate as it is transported through the channel.

17. The apparatus of claim 7, wherein the one or more spray bars are rotatable about their longitudinal axis while disposed within the mounting assembly.

18. The apparatus of claim 7, wherein the locking screw is configured to secure the mounting assembly in a desired position relative to the base.

19. An apparatus comprising:

a fluid vessel comprising a support surface;

a base comprising an elongated rail, the elongated rail coupled to the fluid vessel;

a mounting assembly disposed atop the elongated rail of the base, the mounting assembly comprising:

a crossbar having a plurality of first orifices extending from a top surface of the crossbar to a bottom surface of the crossbar and two distal ends, wherein at least one of the plurality of first orifices is a smooth hole adapted to fit a guide pin;

two or more guide pins disposed within a first set of orifices of the plurality of first orifices of the crossbar and in contact with the base, wherein at least one guide pin is located at each distal end of the crossbar;

two or more levelers disposed within a second set of orifices of the plurality of first orifices and in contact with the base, wherein at least one leveler is located at each distal end of the crossbar;

two or more locking screws disposed within a third set of orifices of the plurality of first orifices and in contact with the base, wherein at least one locking screw is located at each distal end of the crossbar, wherein the first set of orifices, the second set of orifices, and the third set of orifices are distinct from each other; and two arms coupled to the crossbar, each arm orthogonally disposed at one of the two distal ends of the crossbar and comprising a clamp; and one or more spray bars disposed in the clamps of the two arms.

\* \* \* \* \*